(12) United States Patent
Bavencove et al.

(10) Patent No.: US 9,768,350 B2
(45) Date of Patent: Sep. 19, 2017

(54) IN-SERIES ELECTRICAL CONNECTION OF LIGHT-EMITTING NANOWIRES

(71) Applicant: Commissariat A L'Energie Atomique Et Aux Energies Alternatives, Paris (FR)

(72) Inventors: Anne-Laure Bavencove, Moustajon (FR); Philippe Gilet, Teche (FR); Pierre Moller, Versailles (FR)

(73) Assignee: Commissariat A L'Energie Atomique Et Aux Energies Alternatives, Paris (FR)

( * ) Notice: Subject to any disclaimer, the term of this patent is extended or adjusted under 35 U.S.C. 154(b) by 112 days.

(21) Appl. No.: 14/050,760

(22) Filed: Oct. 10, 2013

(65) Prior Publication Data

US 2014/0077156 A1 Mar. 20, 2014

Related U.S. Application Data

(63) Continuation of application No. PCT/FR2012/051033, filed on May 10, 2012.

(30) Foreign Application Priority Data

May 18, 2011 (FR) ...................................... 11 54313

(51) Int. Cl.
*H01L 33/06* (2010.01)
*H01L 33/08* (2010.01)
(Continued)

(52) U.S. Cl.
CPC ............ *H01L 33/08* (2013.01); *H01L 27/153* (2013.01); *H01L 33/06* (2013.01); *H01L 33/24* (2013.01);
(Continued)

(58) Field of Classification Search
None
See application file for complete search history.

(56) References Cited

U.S. PATENT DOCUMENTS 7,535,028 B2 5/2009 Fan et al.
7,679,077 B2 3/2010 Yao et al.
(Continued)

FOREIGN PATENT DOCUMENTS

FR WO 2011020959 A1 * 2/2011 ........... H01L 27/153
WO 2006/080609 8/2006
(Continued)

OTHER PUBLICATIONS

International Search Report, International Application No. PCT/FR2012/051033, dated Mar. 1, 2013 (4 pages).
(Continued)

*Primary Examiner* — Bradley K Smith
*Assistant Examiner* — David Goodwin
(74) *Attorney, Agent, or Firm* — Burr & Brown, PLLC

(57) ABSTRACT

An optoelectronic device includes at least first and second light-emitting nanowires on a support, each comprising an area for the injection of holes and an area for the injection of electrons, a series electric connection including a connection nanowire on the support, which includes a first region forming an electric path with the hole injection area of the first nanowire, a second region forming an electric path with the electron injection area of the second nanowire, and a third region enabling a current to flow between first and second regions. Also included are a first conductive area connecting the hole injection area of the first nanowire and the first region of the connection nanowire and electrically insulated from the second nanowire, and a second conductive area connecting the second region of the connection
(Continued)

nanowire and electron injection area of the second nanowire and electrically insulated from the first nanowire.

7 Claims, 12 Drawing Sheets

(51) Int. Cl.
*H01L 27/15* (2006.01)
*H01L 33/24* (2010.01)
*H01L 33/62* (2010.01)

(52) U.S. Cl.
CPC ...... *H01L 33/62* (2013.01); *H01L 2924/0002* (2013.01)

(56) References Cited

U.S. PATENT DOCUMENTS

| | | | |
|---|---|---|---|
| 8,193,015 B2* | 6/2012 | Horng | H01L 27/156 257/594 |
| 8,350,279 B2* | 1/2013 | Lee | H01L 25/0753 257/103 |
| 8,426,224 B2 | 4/2013 | Wang et al. | |
| 8,487,340 B2 | 7/2013 | Gilet et al. | |
| 8,535,962 B2 | 9/2013 | Gilet et al. | |
| 2005/0253138 A1 | 11/2005 | Choi et al. | |
| 2006/0169993 A1 | 8/2006 | Fan et al. | |
| 2006/0292839 A1* | 12/2006 | Yi | B82Y 10/00 438/570 |
| 2007/0057248 A1 | 3/2007 | Yao et al. | |
| 2008/0157057 A1 | 7/2008 | Kim | |
| 2008/0164485 A1 | 7/2008 | Lee | |
| 2008/0230765 A1* | 9/2008 | Yoon | H01L 27/156 257/13 |
| 2009/0294757 A1* | 12/2009 | Wernersson | B82Y 10/00 257/14 |
| 2010/0136414 A1 | 6/2010 | Choi et al. | |
| 2010/0148149 A1* | 6/2010 | Pedersen | H01L 33/24 257/13 |
| 2010/0219425 A1 | 9/2010 | Lee | |
| 2011/0240959 A1* | 10/2011 | Konsek | H01L 29/0673 257/13 |
| 2012/0001153 A1 | 1/2012 | Hersee et al. | |
| 2012/0164767 A1* | 6/2012 | Gasse | H01L 27/153 438/27 |
| 2012/0205613 A1* | 8/2012 | Mi | B82Y 10/00 257/9 |
| 2013/0112945 A1* | 5/2013 | Gilet | H01L 33/06 257/13 |
| 2013/0175501 A1 | 7/2013 | Hersee et al. | |

FOREIGN PATENT DOCUMENTS

| | | |
|---|---|---|
| WO | 2007/141333 | 12/2007 |
| WO | 2008/048704 | 4/2008 |
| WO | 2008/140611 | 11/2008 |
| WO | 2009/087319 | 7/2009 |
| WO | 2010/071594 | 6/2010 |
| WO | 2011/020959 | 2/2011 |

OTHER PUBLICATIONS

Gardner, N. F. et al., "Blue-emitting InGaN—GaN double-heterostructure light-emitting diodes reaching maximum quantum efficiency above 200 A/cm$^2$," Applied Physics Letters 91, 243506 (2007) (2 pages).

* cited by examiner

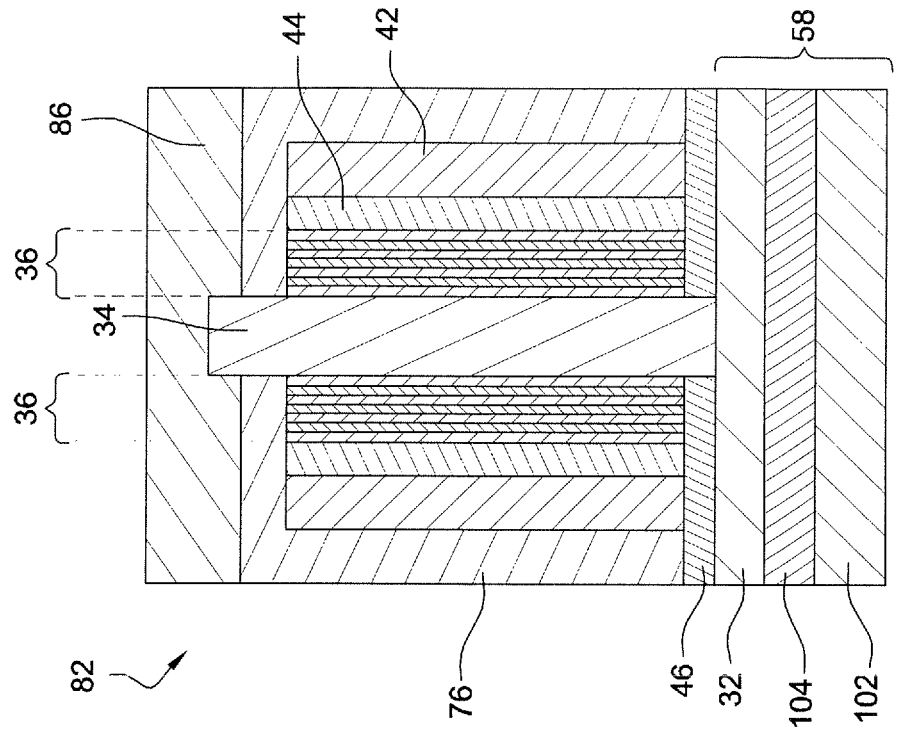
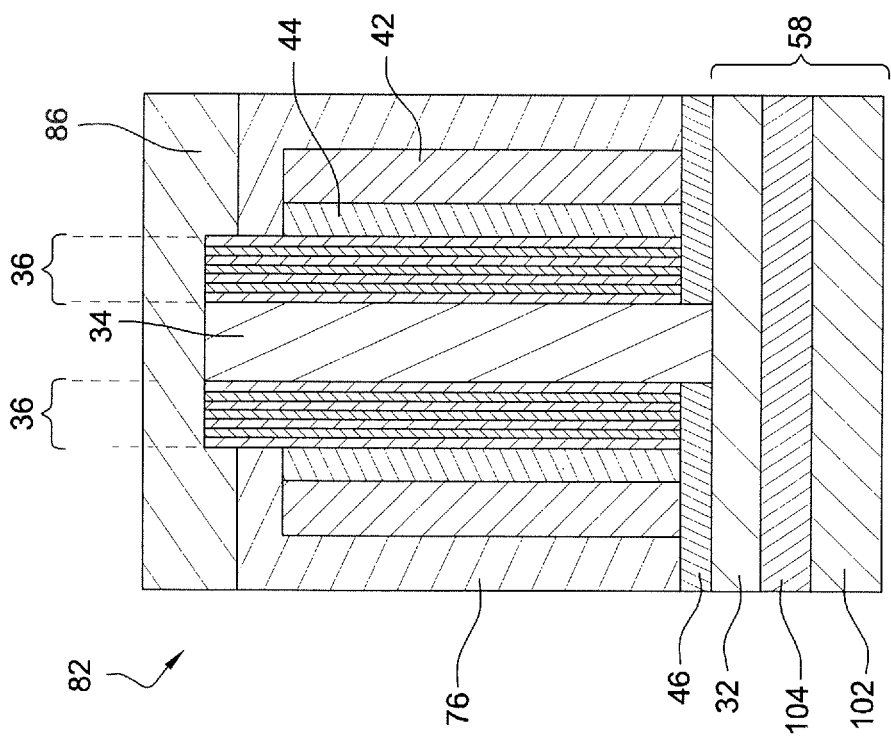

IN-SERIES ELECTRICAL CONNECTION OF LIGHT-EMITTING NANOWIRES

BACKGROUND OF THE INVENTION

1. Field of the Invention

The invention relates to optoelectronic devices based on nanowires for the generation of light, and especially LEDs (light-emitting diodes).

2. Description of Related Art

Schematically, a LED comprises a semiconductor area for electron injection, a semiconductor area for hole injection, and a so-called "active" semiconductor area where the injected electrons and holes radiatively recombine.

The first technology used to manufacture LEDs is the so-called "planar" technology. Because planar technology raises a number of issues, especially in terms of quantum efficiency and/or in terms of mesh matching between the different materials used and/or in terms of limitation of the wavelength capable of being emitted, LEDs based on nanowires having multiple quantum well confinement structures have been developed. Such nanowires, and more specifically their manufacturing method, indeed have a number of advantages, and in particular:

- a growth of nanowires on substrates, with the possibility for each nanowire to be made of a material with a mesh parameter mismatch with respect to the other. Thus, silicon, which is a low-cost substrate capable of being manufactured with a large size and conductive, can be envisaged for the growth of nanowires made of III-N material, which is impossible in planar technology. This variation has advantages both in terms of production cost and of simplification of manufacturing processes, especially at the electrical injection level;
- a good crystal quality due to the relaxation of the stress at the free surfaces. Thus, a decrease in the number of non-radiative recombination centers with respect to planar structures, and especially an absence of through dislocations which would adversely affect the quantum efficiency of LEDs, can be observed; and
- a better extraction of light without complicating manufacturing processes.

Two categories of nanowires used to form LEDs can be distinguished in the art:

- that where the active area of the nanowires comprises confinement structures with axial-epitaxy multiple quantum wells, that is, grown along the nanowire growth axis,
- that where the active area of the nanowires comprises confinement structures with radial-epitaxy multiple quantum wells, that is, in a volume formed around the nanowire growth axis.

FIG. 1 schematically shows in cross-section view an example of a nanowire forming a nano-LED 10 with axial-epitaxy multiple quantum wells. Nano-LED 10 is formed of a GaN layer 14 n-doped with silicon, formed on an n+-doped silicon substrate 12, having an active area 16 formed of axial multiple quantum wells made of an alternation of unintentionally doped GaN areas 18 and InGaN areas 20 formed thereon. A GaN area 22 p doped with magnesium is further deposited on a p-doped AlGaN electron-blocking area 24, commonly called EBL ("Electron Blocking Layer"), itself deposited on active area 16.

According to this axial geometry, the electrons and the holes are injected into active area 16 respectively by means of substrate 12, via area 14 and area 22, and recombine, at least partly radiatively, in InGaN quantum wells 20 of active area 16.

FIG. 2 schematically shows in cross-section view an example of a nanowire forming a nano-LED 30 with multiple quantum wells grown by radial epitaxy around a core 34 itself deposited on an n+-type doped substrate 32. Nano-LED 30 comprises a core 34 formed of GaN n doped with silicon and a shell comprising active area 36 with radial multiple quantum wells formed of an alternation of unintentionally doped GaN areas 38 and InGaN area 40, an EBL volume 44 surrounds active area 36, EBL volume 44 being itself surrounded with a GaN volume 42 p doped with magnesium.

Areas 36, 44, and 42 are further formed on an electric insulation layer 46, core 34 being formed directly in contact with substrate 32.

According to this radial geometry, the electrons and the holes are injected into active area 36 respectively by means of substrate 32, via core 34, and area 42, and recombine at least partly radiatively in InGaN quantum wells 40 of active area 36. A nanowire architecture where one of the hole and electron injection areas forms a shell at least partly surrounding a core comprising the active recombination area is usually called "core/shell".

Whatever the axial or radial configuration of the nanowires, the electric power supply of an array of nanowires is conventionally performed in parallel. An example of parallel connection is illustrated in FIGS. 3 and 4, which respectively are a simplified top view of a LED comprising an array 50 of nanowires 10, 30, in the illustrated example, an array of three nanowires by three nanowires, and a simplified cross-section view along plane A-A of FIG. 3.

As illustrated, nanowires 10, 30 are embedded in a planarizing layer 52 made of an electrically-insulating material and are connected in parallel between an upper electrode 54, formed on layer 52, and a lower electrode 56, arranged under substrate 12, 32 having nanowires 10, 30 formed thereon. Many parallel connection schemes have been designed, examples being for example described in documents US 2005/0253138, US 2007/0057248, US 2008/0157057, WO2008/048704, WO2008/140611, and WO2010/071594.

For an electric current to be able to flow in a nanowire, said nanowire has to be submitted to a minimum power supply voltage, called "threshold voltage", having a value depending on the morphological properties (height, diameter . . . ), on the structural properties (doping level of the involved semiconductor materials, crystal quality, composition of the wells and of the barriers . . . ) of the nanowire, and on the "local" quality of the contact with the nanowire. Now, nanowires have different threshold voltages due to a dispersion of the morphological and structural properties, given that it is impossible to manufacture strictly identical nanowires.

However, a parallel connection of nanowires imposes a same potential difference for all nanowires. In case of a significant fluctuation of the nanowire threshold voltages, it is thus difficult, or even impossible, to simultaneously switch all nanowires to their conductive state. Further, a parallel connection may create nanowire short-circuits. Indeed, defective nanowires result in the creation of main conduction paths and thus of strong leakage currents. These disadvantages are all the more critical due to the small dimensions of nanowires, which have a diameter commonly ranging between a few nanometers and a few micrometers and a height ranging between a few hundreds of nanometers and a few tens of micrometers, thus making their properties all the more sensitive to defects.

Further, the light intensity of a LED mainly is a function of the intensity of the current that it conducts, and not of the value of the power supply voltage applied to the supply electrodes. If a substantially identical potential difference is imposed for all nanowires, and due to the differences between the properties thereof, the electric currents crossing the nanowire may thus be different, which may generate significant variations in the luminous power emitted from one nanowire to another.

At the same time, the series connection of light-emitting devices is known and is for example described in documents U.S. Pat. No. 7,535,028 and WO 2011/020959. However, the series connection here relates to devices having large lateral dimensions. Thus, the first document refers to a series connection of planar LEDs while the second document considers the connection of LED devices gathering nanowires interposed between two planar electrodes.

Due to the small diameter of nanowires, state-of-the-art series connection techniques cannot be applied. There especially are impassable technological barriers given the involved dimensions and the growth methods used. For example, it can easily be understood that the series connection by a gold wire of document WO 2011/020959 cannot be used to connect two adjacent nanowires in series. Similarly, it can easily be understood that the series connection described in document U.S. Pat. No. 7,535,028, which requires inclined sides to provide the deposition of a metal contact on a trench cannot be used to connect two substantially vertical nanowires in series.

SUMMARY OF THE INVENTION

The present invention aims at providing an electric connection which enables to series-connect light-emitting nanowires.

For this purpose, the present invention aims at an optoelectronic device comprising at least:
- a first and a second light-emitting nanowires formed on a support and each comprising a semiconductor area of a first type for the injection of holes and a semiconductor area of a second type for the injection of electrons;
- a series electric connection of the first and second light-emitting nanowires comprising:
  - a connection nanowire formed on the support and comprising:
    - a first region capable of forming with the hole injection area of the first nanowire an electric path enabling an electric current to flow;
    - a second region capable of forming with the electron injection area of the second nanowire an electric path enabling an electric current to flow; and
    - a third region in contact with the first and second regions enabling an electric current to flow therebetween;
  - a first conductive area connecting the hole injection area of the first nanowire and the first region of the connection nanowire and electrically insulated from the second nanowire; and
  - a second conductive area connecting the second region of the connection nanowire and the electron injection area of the second nanowire and electrically insulated from the first nanowire.

The main difficulty of connecting nanowires in series is the fact that the hole injection area and the electron injection area are arranged at opposite ends. The series connection of two nanowires, which comprises connecting the hole injection area of a nanowire to the electron injection area of the other nanowire thus requires passing a trench. The invention enables to easily pass this trench by using a nanowire. The trench being thus passed, there is no further technological barrier in the manufacturing of the other elements of the series connection, that is, the conductive areas which may for example, but not exclusively, be formed by means of a planar manufacturing technique. Further, the connection nanowire may be of the same type as the nanowires to be connected and may thus be manufactured at the same time as the light-emitting nanowires.

According to an embodiment, each of the first and second light-emitting nanowires comprises a semiconductor core, having its end formed on the support forming the hole injection area or the electron injection area, and a semiconductor shell surrounding the core at least over an upper portion thereof and forming the other area among the hole injection area and the electron injection area. In other words, the light-emitting nanowires appear in a so-called "core/shell" architecture.

More specifically:
- the core of the first and second nanowires is formed of a semiconductor material of a first conductivity type;
- the shell of the first and second nanowires is made of a semiconductor material of a second conductivity type, opposite to the first conductivity type; and
- the connection nanowire comprises at least one core made of the material of the first conductivity type.

According to this variation, the nanowires thus have a core/shell architecture comprising:
- an active semiconductor area for the radiative recombination of formed electron/hole pairs, that is, the nanowire core;
- a semiconductor area for the radial injection of holes into the or each nanowire, that is, the shell; and
- a semiconductor area for the axial injection of electrons into the or each nanowire, that is, the end of the core in contact with the support.

"Axial injection" here means that the injection of electrons into the active area is mainly performed along the nanowire growth direction. For example, electrons are injected through the base of the nanowire. "Radial injection" here means that the hole injection into the active area is mainly performed through the lateral surface of the nanowire. For example, the hole injection area at least partially surrounds the active area along part of its height.

In other words, the fact of providing the axial injection of electrons enables to free the nanowire core for the active area, which then takes up most of the nanowire bulk. Indeed, due to their very high mobility, electrons occupy the entire volume of the active area, despite the small injection surface area.

Then, since the device is based on nanowires, it is possible to obtain a good confinement of charge carriers while limiting their concentration, causing the "efficiency droop", by an appropriate selection of the height of the nanowires, as will be explained in further detail hereafter.

Then, since the nanowires are not sensitive to the mesh parameter, the selection of the height of the nanowires, especially to obtain an appropriate current density with no efficiency droop, is decorrelated from the selection of the composition of the semiconductor forming the active area, for example, the indium composition in the case of a GaN-based device. There can thus be a wider choice for the emission wavelength. It is thus possible to manufacture LEDs based on nanowires emitting in the visible range, especially from blue to red in the case of a GaN-based LED, or even to form a LED emitting white light by varying the indium composition during the epitaxy of the nanowire core.

Further, since the active area forms most of the nanowire bulk, the device according to the invention has an improved internal quantum efficiency even with a strong injection current density.

According to an embodiment, the connection nanowire comprises a semiconductor core of the first type having no shell on at least a first and a second portion respectively forming the first and the second region of the connection nanowire. Especially, the first portion of the core of the connection nanowire comprising no shell comprises the end of the nanowire opposite to the support.

In other words, the connection nanowire originally is a light-emitting nanowire according to the core/shell architecture which has been "stripped" of its shell at its end opposite to the support. An electric path is thus obtained between the different nanowires formed of an alternation of semiconductors of the first type and of semiconductors of the second type, for example n-p-n-p alternations. The nanowires can thus be manufactured simultaneously while ascertaining a good flowing of the current therebetween.

According to an embodiment, the connection nanowire is made of a conductive material, thus providing an electric connection of low resistivity.

According to an embodiment, the support comprises an electrically-insulating planar layer having a planar conductive contact forming the second conductive area, said contact having the connection nanowire and the second nanowire formed thereon.

According to an embodiment, the nanowires are embedded in a planar electrically-insulating layer, the ends of the nanowires opposite to the support slightly emerging from said layer, said layer having a conductive contact forming the first conductive area and surrounding the emerging ends of the first nanowire and of the connection nanowire formed thereon. Planar manufacturing techniques can thus be implemented.

According to an embodiment, the device comprises a network of light-emitting nanowires series-connected by series electric connections.

According to an embodiment, the device comprises a network of light-emitting nanowires formed of at least two assemblies of light-emitting nanowires electrically connected in parallel, at least one nanowire of an assembly being series-connected with a nanowire of the other assembly by a series electric connection.

The invention also aims at a method for manufacturing an optoelectronic device comprising at least a first and a second light-emitting nanowires formed on a support and comprising a semiconductor core having its end formed on the support forming a hole injection area or an electron injection area, and a semiconductor shell surrounding the core at least over an upper portion thereof and forming the other area among the hole injection area and the electron injection area, said method comprising the steps of:
  forming a support comprising an electrically-insulating layer having a lower conductive layer formed thereon;
  forming on the support three identical light-emitting nanowires, each comprising a semiconductor core of a first type and a semiconductor shell of a second type surrounding the core over at least an upper portion thereof, two of the nanowires being formed on the electric contact;
  depositing a planar and electrically-insulating layer on the support to surround the nanowires while letting their free ends slightly emerge from said layer; removing a portion of the shell from the free end of one of the two nanowires formed on the lower conductive layer to disengage the core thereof; and
  depositing an upper electric contact on the planar insulating layer to surround the free end of the nanowire which is not formed on the lower conductive layer and the free end of the nanowire having had part of its shell removed.

BRIEF DESCRIPTION OF THE DRAWINGS

The present invention will be better understood on reading of the following description provided as an example only in relation with the accompanying drawings, where the same reference numerals designate the same or similar elements, and among which:

FIGS. 6a, 6b, and 6c are simplified cross-section views of connection nanowires formed from the nano-LED of FIG. 2;

DETAILED DESCRIPTION OF THE INVENTION

Figure 2:
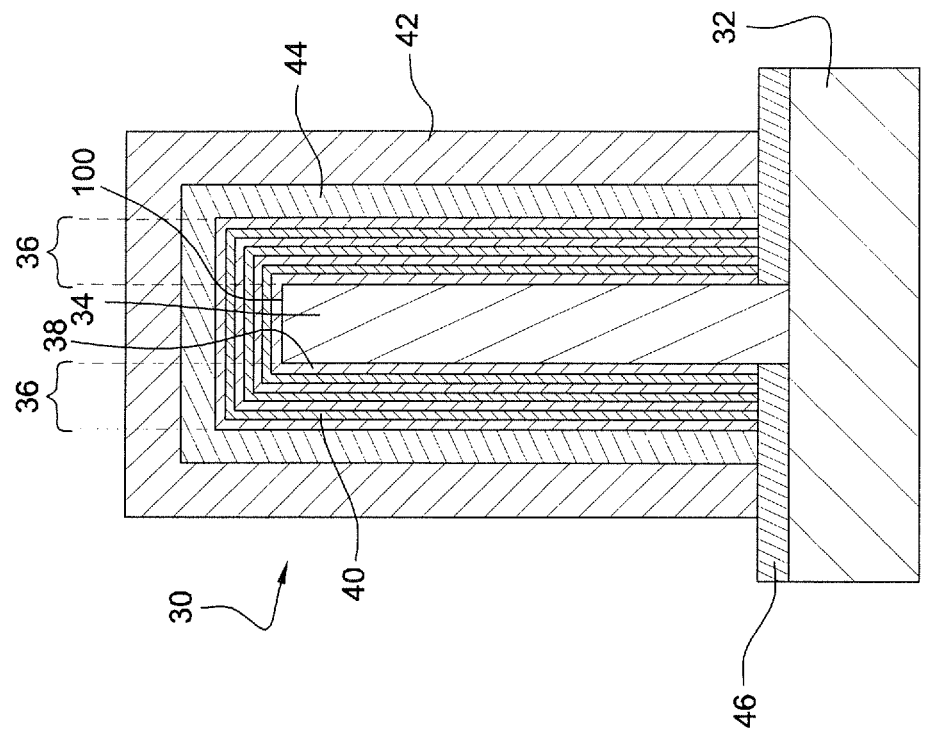
FIG. 2 is a simplified cross-section view of a nano-LED with radial multiple quantum wells of the state of the art, such as described in the preamble.

An electric series connection of the invention for electrically connecting a first and a second nanowires forming core/shell-type nano-LEDs 60, 62 formed on a support 58 in series will now be described in relation with FIG. 5.

Schematically, nano-LEDs 60, 62 each comprise:
- a core 64, 66, where the active area where holes and electrons at least partly radiatively recombine is located;
- an area 68, 70 of injection of charge carriers of a first type into the active recombination area, for example, a hole injection area, forming a shell surrounding core 64, 66 along a portion at least of the height of core 64, 66;
- an area 72, 74 of injection of charge carriers of the second type into the active recombination area, for example, an electron injection area, comprising at least the foot of the nano-LED, that is, the end of the nano-LED resting on support 58.

In the illustrated embodiment, the nano-LEDs are embedded in an electrically-insulating planarizing layer 76 formed on support 58, except for their ends 78, 80 opposite to support 58, called "head" hereafter, which emerge from layer 76.

The series electric connection between nano-LEDs 60, 62 has the function of establishing an electric path between hole injection area 68 of first nano-LED 60 and electron injection area 74 of second nano-LEDs 62, and comprises for this purpose:
- a connection nanowire 82, formed on support 58 and embedded in layer 76 except for its head 84;
- a first contact 86 formed on layer 76, electrically connecting head 78 of first nano-LED 60 to head 84 of connection nanowire 82, and electrically insulated from second nano-LED 62; and
- a second contact 88 of support 58, electrically connecting foot 90 of connection nanowire 82 to foot 74 of second nano-LED 62, and electrically insulated from first nano-LED 60.

The nature of nano-LEDs 60, 62 may strongly vary, especially as concerns the nature of the materials and the structure of areas of hole injection 68, 70 and of electron injection 72, 74. Connection nanowire 82 is thus functionally divided into at least three areas:
- a first area comprising head 84 of nanowire 82 which is "electrically compatible" with hole injection area 68 of first nano-LED 60;
- second area comprising foot 90 of nanowire 82 which is "electrically compatible" with electron injection area 74 of second nano-LED 62; and
- a third median area 92 of connection nanowire 82 between head 84 and foot 90, which enables a current to flow between first and second areas 82, 90.

"Electrically compatible" here especially means the fact that the electric series connection of the different involved areas forms no obstacle to the flowing of a current. Especially, nano-LEDs 60, 62 comprise semiconductor areas of different types capable of forming PN junctions. Similarly, connection nanowires 82 may also comprise one or several semiconductor materials, as will be explained in detail hereafter. Thus, for example, the electric series connection of the nano-LEDs comprises no series-connection of a PN junction with an NP junction, in which case there exist series-connected head-to-tail diodes opposing the current flow.

The previous description of connection nanowire 82 is simplified and functional. Especially, the nanowire areas may be made of different materials, or two areas, or even the three areas, may be made of the same material. Similarly, an axial arrangement of the three areas of the connection nanowire has been described. One or several areas may however be structurally at least partly radial.

Figure 5:
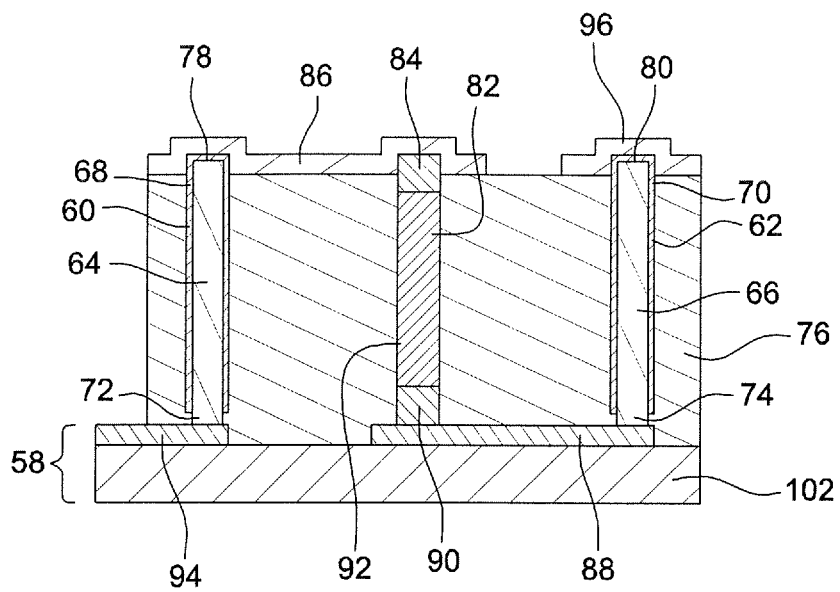
FIG. 5 is a simplified cross-section view of a series electric connection of two nano-LEDs (light-emitting nanowires) of core/shell type.

FIG. 5 also shows lower and upper contacts 94 and 96, respectively in contact with foot 72 of first nano-LED 60 and head 80 of second nano-LED 62 for the electric power supply of the nano-LEDs. As illustrated, a portion of lower contact 94 is free to enable its connection to the electric power supply. Since only two nano-LEDs 60, 62 are shown, such nano-LEDs are also used in this example as input and output terminals of the electric series connection. Of course, more than two nano-LEDs may be series-connected according to the above-described scheme. Lower and upper contacts 94 and 96 are then for example respectively associated with the two endmost nano-LEDs of this series connection. Lower contact 94 is advantageously, but not necessarily, of same nature as second contact 88 electrically connecting second nano-LED 62 to connection nanowire 82. Similarly, upper contact 96 is advantageously, but not necessarily, of same nature as first contact 86 electrically connecting connection nanowire 82 to first nano-LED 60.

Layer 76 has the function of providing an insulating surface on which to form electric connection contacts between the nanowire heads. Of course, any other means providing this function are appropriate in the context of the invention.

Several embodiments of the invention will now be described, it being understood that the characteristics relative to the connection nanowires described in an embodiment may be combined with the characteristics of the support of another embodiment. Similarly, the characteristics of the power supply contacts described in an embodiment may apply and/or be substituted to the characteristics of power supply contacts of another embodiment.

According to a first embodiment, connection nanowire 82 is made of an electrically-conductive material. For example, connection nanowire 82 is metallic, which enables to obtain both a connection of high quality and a perfect compatibility with any type of nano-LED, whatever the materials and the structure of the hole and electron injection areas.

This however has the disadvantage of complicating the manufacturing process of an array of nano-LEDs since two types of manufacturing processes have to be provided, one for the nano-LEDs and the other for the connection nanowires.

According to a second embodiment, the connection nanowire is a nano-LED which has then been modified be used as a connection nanowire. This enables to manufacture all the nanowires, nano-LEDs, and connection nanowires, during a same growth process.

Figure 6A:
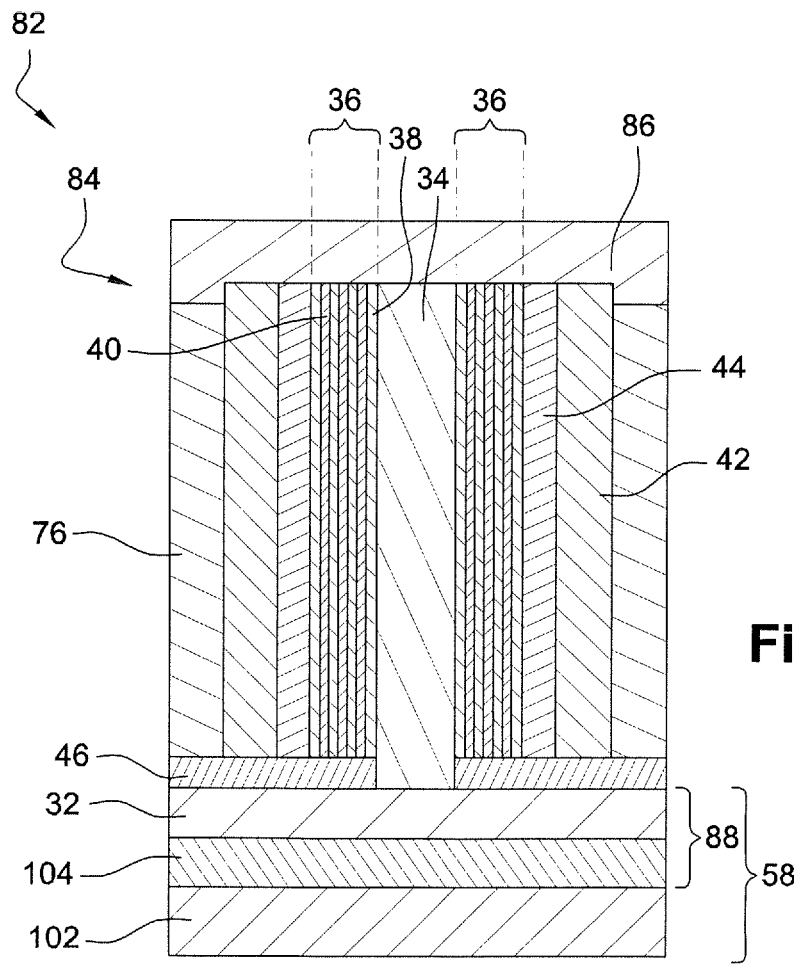

An application of the second embodiment to the core/shell nano-LEDs of FIG. 2 is now described in relation with FIGS. 6*a*, 6*h*, and 6*c*.

A nano-LED 30 is thus modified to remove a portion of shell 42 from head 84 thereof, and especially at least the portion of shell 42 covering upper surface 100 of core 34 of the nano-LED. This thus disengages core 34, which is electrically compatible with shell 42 forming a hole injection area of nano-LEDs 60, 62, and which is covered with first area 86 of the series connection, for example, a metal contact 86.

In the example illustrated in FIG. 6a, the top of nano-LED 30 has been removed to disengage core 34 while leaving in contact active area 36, as well as volumes 42 and 44, with conductive area 86.

In the example illustrated in FIG. 6b, the top of nano-LED 30 has been removed, as well as volumes 42 and 44 along part of the height of nano-LED 30, while leaving active area 36 in contact with conductive area 86.

In the example illustrated in FIG. 6c, the top of nano-LED 30 has been removed, as well as active area 36 and volumes 42 and 44 along part of the height of nano-LED 30, while however avoiding the contact of active area 36 with conductive area 86.

Support 58 for example comprises a common insulating substrate 102 and second contact 88 of the series connection is for example formed of an electrically-conductive layer, especially metallic, or a heavily-doped semiconductor layer of same type as core 34, deposited on insulating substrate 102.

As a variation, second contact 88 comprises a first electrically-conductive metallic or heavily-doped semiconductor layer 104, deposited on insulating substrate 102, and a second semiconductor layer 32, for example, similar to that of the state of the art having the nano-LEDs formed thereon. Finally, insulating and planarizing layer 76 is for example made of the same material as insulating layer 46.

Preferably, all nano-LEDs are formed on portions of support 58 of this type.

To increase the light emission and decrease the absorption by substrate 102, the metal layer forming second contact 88 is preferably made of a metal reflecting the emission wavelength, for example, aluminum or silver. Similarly, the metal layer of contact 88 advantageously substantially covers the entire surface of common substrate 102, the metal layer being for example deposited full plate on substrate 102, and then etched to isolate connection nanowire 82 of first nano-LED 60. If the material of the metal layer is, conversely, selected to be made of a metal absorbing the wavelength emitted by the nano-LEDs, for example, for the needs of the application or due to manufacturing constraints, the surface of second contact 88 is then selected to be as low as possible.

Figure 3:
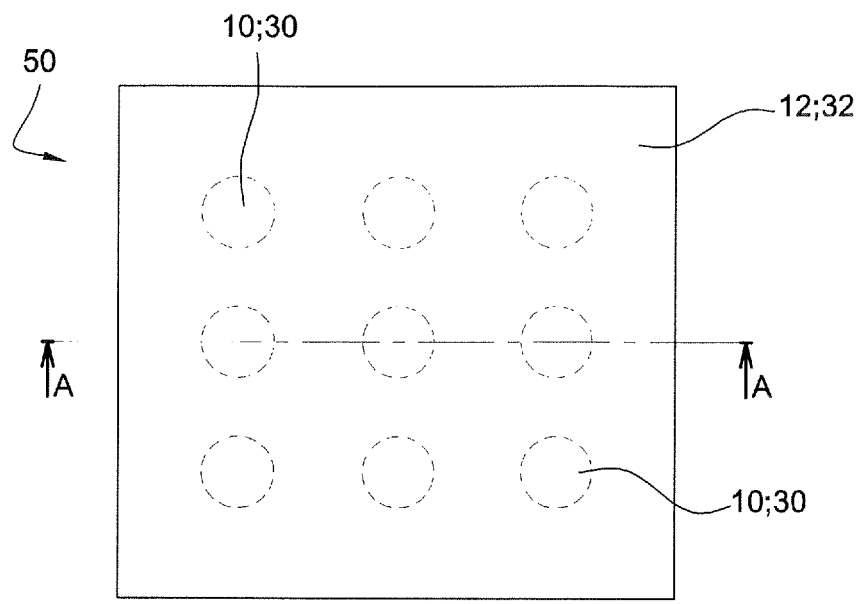
FIG. 3 is a simplified top view of an array of nanowires electrically connected in parallel and forming a LED, such as described in the preamble.
Figure 4:
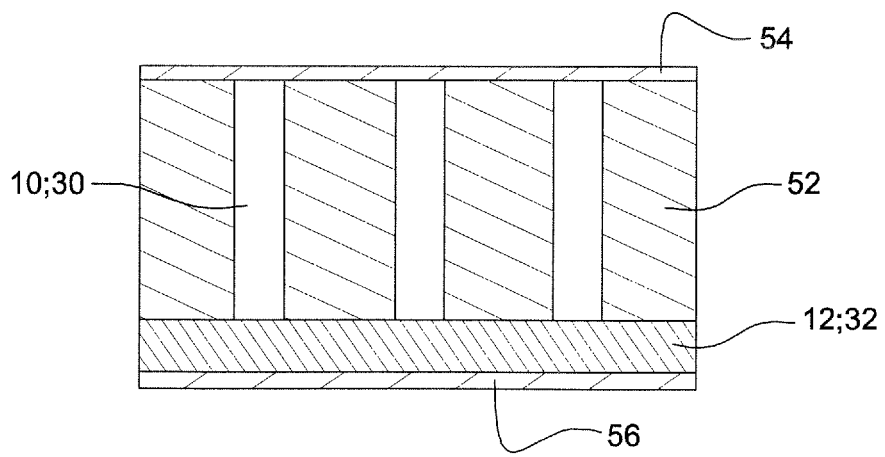
FIG. 4 is a cross-section view of the array of FIG. 3 along plane A-A, such as described in the preamble.
Figure 7:
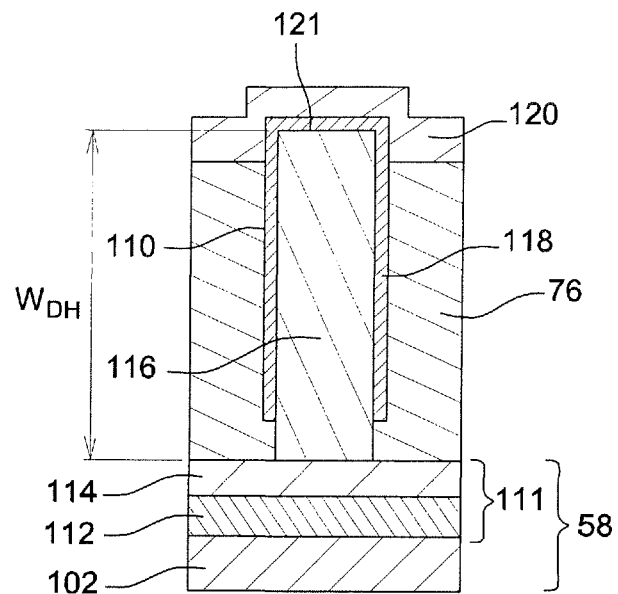
FIGS. 7 and 8 respectively are simplified cross-section views of a nano-LED having an active core and of a connection nanowire obtained from such a nano-LED.
Figure 8:
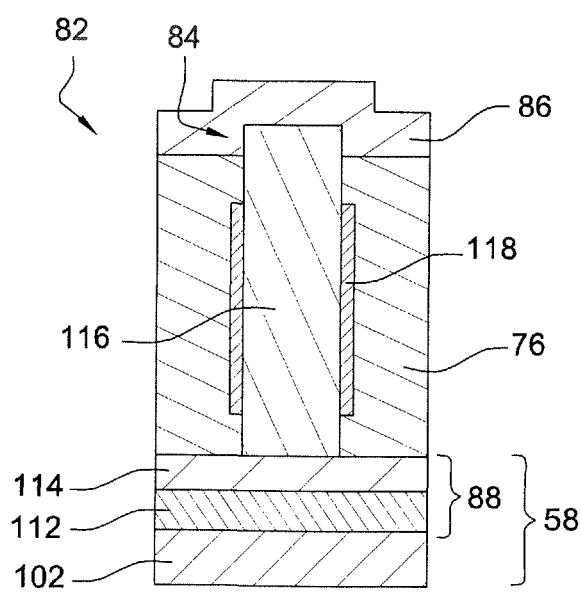

An application of the second embodiment to the core/shell nano-LEDs of FIG. 7 is now described in relation with FIG. 8. It should be noted that nano-LEDs shown in FIG. 7 may be connected in parallel, for example, according to the connection diagram described in FIGS. 3 and 4.

Referring to FIG. 7, a nano-LED 110 is formed on a portion of support 58 comprising a common insulating substrate 102 having an electrically-conductive layer 111, for example a metallic or doped semiconductor layer, deposited thereon. As a variation, layer 111 comprises a first electrically-conductive layer 112 deposited on substrate 102 and having an n-type GaN layer 114 formed thereon. The portion of support 58 is for example formed of a metal described hereabove in relation with FIG. 6 or of a doped semiconductor.

Nano-LED 110 comprises a core 116 made of a semiconductor material from the III-V or II-VI family, preferably the III-N family. Core 116 is surrounded at least on its upper portion with a shell 118 made of a p-doped semiconductor material from the same family as the material of core 116, but having a greater energy gap to allow the injection of holes from shell 118 to core 116. Shell 118 is preferably isolated from support 58 to avoid any short-circuit between upper electric contact 120 and lower conductive layer 111. For example, shell 118 stops above support 58. Finally, nano-LED 110 is embedded in an insulating and planarizing layer 76, except for its head, and an upper electric contact 120 formed on layer 76, for example, area 86 of the electric connection.

Nano-LED 110 operates as follows. Electrons are injected into core 116 via conductive layer 111 of support 58 and holes are injected into shell 118 via contact 120. The injected electron-hole pairs thus recombine, at least partly radiatively, in core 116 which forms an active layer.

It should be noted that the fact that the electron injection is performed axially, in the example, through the nanowire base, is not limiting in terms of electric injection due to the high mobility of electrons. Further, any point of core 116, that is, of the active area, is at a distance shorter than or equal to the core radius. The hole injection surface area is thus very large and very close to each point of the active area.

In the case where layer 111 comprises a semiconductor layer, this layer is advantageously selected to have a low resistivity, especially on the order of 0.001 ohm/cm, to ease the electron injection into core 116, and is for example made of n+-doped GaN having a 400-nanometer thickness. Such a layer may on the other hand support the epitaxy of the GaN nanowires.

Further, any type of semiconductor material capable of being energy-modulated and grown by epitaxy in the form of nanowires may form core 116 and shell 118. For example, nano-LED 110 is made from GaN: core 116 is made of unintentionally doped InGaN, comprising a residual n doping lower than $10^{16}$ electrons/cm$^3$, having an indium composition selected according to the wavelength to be emitted by nano-LED 110. Shell 118 is made of GaN p doped with magnesium or of InGaN p doped with magnesium having a lower indium composition than core 116, the material of shell 118 having a concentration of p carriers on the order of $10^{18}$ holes/cm$^3$.

As a variation, nano-LED 110 is based on ZnO: core 116 is made of ZnO and p-doped shell 118 is made of ZnMgO, or core 116 is made of ZnCdO and shell 118 is made of ZnO.

Still as a variation nano-LED 110 is based on GaAlAs, core 116 is made of GaAs and p-doped shell 118 is made of GaAlAs, or core 116 is made of InGaAs and shell 118 is made of GaAs.

According to still another variation, nano-LED 110 is based on AlInGaP, core 116 is made of AlGaInP, and shell 118 is made of the same material but with a greater aluminum content.

Upper electric contact 120 is semi-transparent to the emission wavelength of the nano-LED and may be formed of different stacks, such as for example a semi-transparent contact formed of thin layers of Ni and Au, or of indium-tin oxide (ITO). It may be locally covered with a thick comb, for example, thicker Ni and Au layers to decrease its series resistance.

Due to its nanowire architecture, which can be achieved whatever the type of selected semiconductor material due to the little influence of the mesh parameter, there is a wide choice in terms of wavelength emitted by the LED.

It should also be noted that nano-LED 110 has a structure of double heterostructure type since it comprises a first heterostructure formed of core 116 and of the conductive or semiconductor surface of support 58, and a second heterostructure formed of core 116 and of shell 118.

Nano-LEDs 110 may be electrically connected in series by using as a connection nanowire 82 a modified nano-LED 110, as illustrated in FIG. 8. A nano-LED 110 is modified to remove a portion of shell 118 from head 84 thereof, and especially at least the portion of shell 118 covering upper surface 121 of core 116 of the nano-LED. This thus disengages core 116, which is electrically compatible with shell 118 forming the hole injection area of nano-LEDs 110. First and second areas 86, 88 of the series connection respectively are areas 120 and 111 described in relation with FIG. 7.

Figure 1:
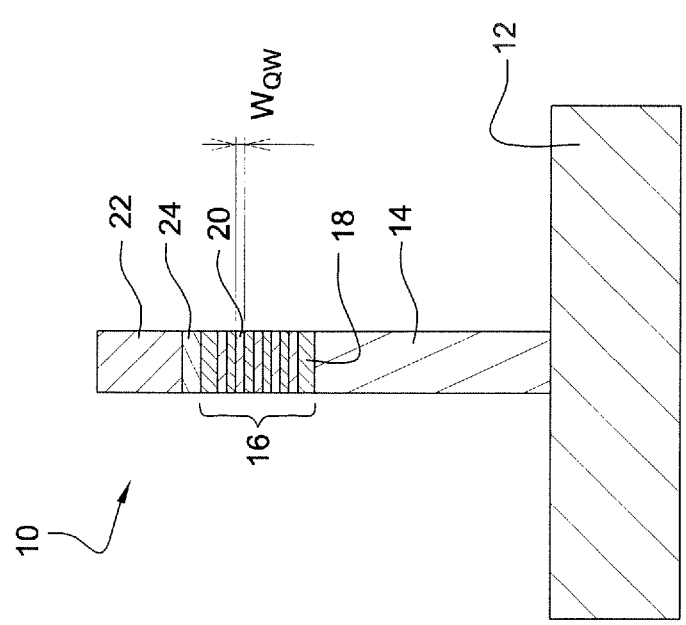
FIG. 1 is a simplified cross-section view of a nano-LED with axial multiple quantum wells of the state of the art, such as described in the preamble.

As compared with conventional nano-LEDs, such as for example described in relation with FIGS. 1 and 2, nano-LEDs 110 require no EBL area. Such an area is usually necessary to confine the carriers in structures with multiple quantum wells such as described in FIGS. 1 and 2, for example. Now a growth perfectly controlled both in terms of morphology, of composition, of thickness and doping of the ternary III-N semiconductors of an EBL area (AlGaN) is indispensable to avoid blocking the injected holes, and thus to make a nano-LED efficient. Further, nano-LED 110 has, as compared with nano-LEDs having multiple quantum wells, a much larger active recombination area relative to the total bulk of the nanowire, which implies an increased internal quantum efficiency. Then, since the active area of a nano-LED 110 does not have quantum wells, the current density applicable to the nano-LED before a substantial decrease of its efficiency (efficiency droop phenomenon) is higher.

Taking, for example, the case of an array of series-connected nano-LEDs 110, and with the assumption that nano-LEDs 110 are cylindrical, filling factor F, equal to the ratio between the total area of the bases of nano-LEDs 110 to the area of support 58, can be calculated according to relation:

$$F = \frac{\pi}{4} \cdot d^2 \cdot d_n$$

where:
d is the diameter of nano-LEDs 110; and
$d_n$ is the surface density of nano-LEDs 110, expressed in number of nanowires per cm².

Setting diameter d of the nanowires to 100 nm and their density to $4 \cdot 10^9$ cm⁻², factor F is then equal to 0.314. Factor F enables to weight the macroscopic current density to take into account the difference between the device area and the sum of the areas of the nanowire bases.

Due to the little influence of the mesh parameter, it is possible to verify that the height of active area 116 of nano-LEDs 110 according to the desired current density $J_{overflow}$ is sufficient to avoid any overflow phenomenon.

More specifically, for cores 116 of nano-LEDs 110 made of a semiconductor material assumed to be degenerated such as $$\frac{E_F - E_C}{k \cdot T} \geq 5,$$

that is, under a strong electric injection, having a height $W_{DH}$ (i.e. the height of active area 116), minimum value $J_{overflow}$ of the current density before obtaining a saturation of the states in the active area (or "overflow" current, any additional current generating no radiative recombinations in the active area) is obtained according to the following relation:

$$F \cdot J_{overflow} = \left(\frac{4 \cdot N_C}{3 \cdot \sqrt{\pi}}\right)^2 \cdot \left(\frac{E_F - E_C}{k \cdot T}\right)^3 \cdot e \cdot B \cdot W_{DH}$$

where:
F is the filling factor of nano-LEDs 110;
$N_C$ is the effective conductive state density in the conduction band of the material of core 116 of nano-LEDs 110;
$E_F$ and $E_C$ respectively are the Fermi and conduction levels of the material of core 116 of nano-LEDs 110;
k is Boltzmann's constant;
T is the junction temperature (temperature of the active area) of core 116 of nano-LEDs 110;
e is the elementary charge; and
B is the bimolecular recombination coefficient of the material of core 116 of nano-LEDs 110.

A minimum height $W_{DH}$ of cores 116 of nano-LEDs 110 selected in this manner results in that when a current density $J_{overflow}$ is injected into nano-LEDs 110, the Fermi level of the double heterostructure reaches the top of the energy barrier separating energy levels $E_F$ and $E_C$. The charge carrier density in cores 116 is then maximum, any additional increase of the current density causing no increase of the charge carrier density, since the latter escape from cores 116 without recombining. In other words, for any current density value smaller than or equal to $J_{overflow}$, the carriers do not escape from cores 116, so that the efficiency droop phenomenon is decreased.

Figure 9:
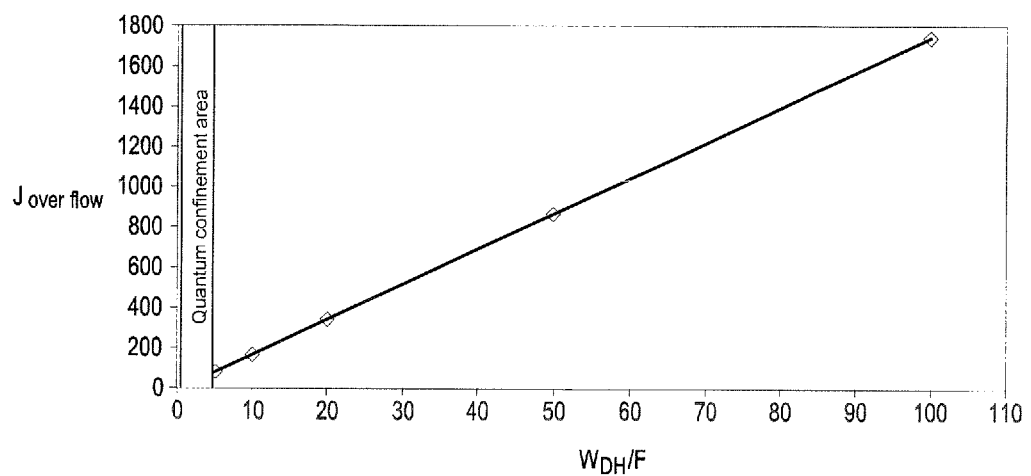
FIG. 9 is a diagram of the maximum current density with no overflow in the LED of FIG. 7.

FIG. 9 is a diagram of value $J_{overflow}$ according to ratio $$\frac{W_{DH}}{F}$$

for nano-LEDs 110 made of InGaN with an indium composition of 15%, for which:
Nc=10¹⁸ cm⁻³;
$E_F$–$E_C$=150 meV;
B=10⁻¹ cm³·s⁻¹;
and T is the junction temperature.

It should advantageously be noted that value $J_{overflow}$ is directly proportional to ratio $$\frac{W_{DH}}{F},$$

and thus to the thickness of the active area, that is, height $W_{DH}$ of cores 116, for a given filling factor F. This is true in the case of a non-quantum confinement, that is, for a ratio $$\frac{W_{DH}}{F}$$

greater than 5 nm. In the case of quantum wells, the quantization of the energy levels makes the current density increase more critical still for the carrier escape.

Given the operating current densities currently desired for LEDs, typically densities greater than or equal to 200 A/cm⁻², minimum ratio $$\frac{W_{DH}}{F}$$

can be set to 15 nm without having a significant drop of the internal quantum efficiency of nano-LEDs 110.

Further, so that it can efficiently play its part as a confinement structure, the maximum height of cores 116 is selected to be smaller than the carrier diffusion length. A maximum height of cores 116 of a few microns provides an efficient confinement.

Cores 116 of nano-LEDs 110 having a minimum height of 40 nm, and having a maximum height which does not exceed a few micrometers thus provide a good confinement of charge carriers while avoiding the internal quantum efficiency drop due to losses by the escaping of carriers out of the active area.

More specifically, for the previously-described InGaN nanowires, a current density greater than or equal to 200 A/cm² before the efficiency droop is obtained.

More generally, this feature is achieved for nano-LED cores made of InGaN, having a ratio $$\frac{W_{DH}}{F}$$

greater than 5 nm, or Having:
- a surface density $d_n$ ranging between $10^6$ and $10^{10}$, for example, a $4 \cdot 10^9 \cdot \text{cm}^{-2}$ density
- cores 116 have a diameter d ranging between 50 nanometers and a few micrometers, for example a diameter of 100 nanometers; and
- the height of the active area of the nanowires ranges between 40 nanometers and some ten micrometers.

As previously mentioned, the structure of nano-LEDs 110 has a higher active volume than conventional nano-LEDs, as for example those illustrated in FIGS. 1 and 2. This property generates both an increase of the internal quantum efficiency due to a greater quantity of active material, and a decrease of the droop efficiency. Indeed, this phenomenon being partly due to the Auger effect, since the density of carriers is inversely proportional to the volume of the active area and the Auger effect varies like the cube of this same density, then a greater active area volume implies a strong drop in the associated non-radiative recombinations, and thus an increase of the radiative efficiency.

For example, by comparing an array of nano-LEDs 110 with an array of nano-LEDs 10 based on nanowires having axial multiple quantum wells described in FIG. 1, and by setting a same nanowire diameter for these nano-LEDs, a same surface density and a same connection diagram (for example, the nano-LEDs are series-connected), the ratio of volume $V_1$ of the active area in LED 110 to volume $V_2$ of the active area in LED 10 is equal to:

$$\frac{V_1}{V_2} = \frac{W_{DH}}{n W_{QW}}$$

where:
n is the number of quantum wells in nano-LED 10, and $W_{QW}$ is the axial dimension of the multiple quantum wells within active area 16.

Table 1 hereafter details the value of ratio $V_1/V_2$ in different configurations:
- LED 110 having an active area with a height $W_{DH}$ of 1 µm or 100 nm; and
- LED 10 containing 5 quantum wells for a thickness $W_{QW}$ equal to 2.5 nm.

Table 1 also details several ratios $V_1/V_2$ according to several assumptions relative to the real operation of nano-LED 10 with multiple quantum wells, that is:
- assumption 1: the radiative recombinations of electron-hole pairs occur throughout the entire volume of active area 16 of the nanowires;
- assumption 2: the thickness of the area where the radiative recombinations occur does not exceed 1 nm, for a real thickness of 2.5 nm. This assumption is based on the results of N. F. Gardner et al.'s publication, "*Blue-emitting InGaN-GaN double-heterostructure light-emitting diodes reaching maximum quantum efficiency above 200 A/cm²*", Applied Physics Letters 91, 243506 (2007), which demonstrate this decrease in the effective thickness of the active area due to the presence of intense internal piezoelectric fields; and
- assumption 3: the radiative recombinations only occur in the quantum well located at closest to hole injection area 22, as is the case for planar InGaN/GaN LED structures with multiple quantum wells.

TABLE 1

|  | Assumption 1: | Assumption 2: | Assumption 3: |
|---|---|---|---|
| $W_{DH}$ = 1 µm $W_{SQ}$ = 2.5 nm | 80 | 200 | 1000 |
| $W_{DH}$ = 100 nm $W_{SQ}$ = 2.5 nm | 8 | 20 | 100 |

This table thus clearly shows that the volume of active material is widely increased in nano-LED 110, from 8 to 1,000 times according to the retained assumption. Accordingly, the internal quantum efficiency of a LED based on nano-LEDs 110 is greatly increased as compared with a LED based on nanowires with axial multiple quantum wells 10.

Similarly, by comparing an array of nano-LEDs 110 with an array of nano-LEDs 30 based on nanowires with radial multiple quantum wells described in FIG. 2, and setting the diameter outside of the hole injection area, as well as the nanowire surface density and the connection diagram to be identical for the two nano-LEDs, the ratio of volume $V_1$ of the active area in the array of nano-LEDs 110 to volume $V_3$ of the active area in the array of nano-LEDs 30 is equal to:

$$\frac{V_1}{V_3} = \frac{\pi \cdot R_1^2 \cdot L_1}{2 \cdot \pi \cdot R_3 \cdot L_3 \cdot n \cdot W_{QW}}$$

where:
$R_1$ is the radius of core 116 of nano-LEDs 110;
$L_1 = W_{DH}$ is the length of core 116 of nano-LED 110;
$R_3$ is the radius without volumes 42 and 44 of nano-LEDs 30;
$L_3$ is the height of nano-LEDs 30;
$W_{QW}$ is the thickness of the multiple quantum wells of nano-LEDs 30, that is, the thickness of the cylinder formed by an InGaN layer 40 of active area 36 of nano-LEDs 30; and
N is the number of quantum wells of nano-LEDs 30.

Table 2 details different ratios $V_1/V_3$ for $R_1=R_3=R=50$ nm, L1=L3, n=5, and $W_{QW}=2.5$ nm, as well as for the previously-described assumptions relative to the real operation of nano-LED 30.

TABLE 2

|  | Assumption 1: | Assumption 2: | Assumption 3: |
|---|---|---|---|
| R = 50 nm | 2 | 5 | 25 |

Here again, a significant increase of the volume gain, and thus of the gain of internal quantum efficiency of a LED based on nano-LEDs 110 with respect to a LED based on nano-LEDs 30 can be observed.

It should be noted that the active volume gain of the structure of nano-LED 110 even enables an array of series-connected nano-LEDs 110 to have an active volume equal to or greater than the volume of an array of nano-LEDs 10 or 30 connected in parallel. Thus, for example, in the worst case, the active volume of an array of series-connected nano-LEDs 110 is equal to the active volume of an array of nano-LEDs 30 connected in parallel, the ratios disclosed in tables 1 and 2 being divided by two due to the fact that a nano-LED 110 represents one nanowire out of two in a series connection with respect to a parallel connection.

Similarly, it should be noted that it is possible to compensate for the nano-LED density loss due to the presence of connection nanowires 82. For example, by assuming an array of series-connected nano-LEDs 30, of density D, of core height L3, and of radius R containing a radial active area formed of n quantum wells of thickness $W_{QW}$. At the same time, considering the case of a planar LED, and with no surface density loss, formed of an equivalent active area, that is, n quantum wells having a thickness $e=W_{QW}$, the ratio of the active volume in an array of nano-LEDs 30 to the active volume in the planar structure for a fixed surface S of support 58 is provided by the following formula:

$$\frac{2\pi \times R \times L3 \times n \times W_{QW} \times D \times S}{n \times e \times S} = 2\pi \times R \times L3 \times D$$

Thus, the condition for the active volume in the array of nano-LEDs 30 to be greater than the active volume of the planar structure is thus provided by:

$$L3 > \frac{1}{2 \times \pi \times D \times R}$$

For example, a possible density of nanowires (nano-LEDs 30 and connection nanowires 82) is on the order of $1 \cdot 10^7$ wires/cm$^2$, which amounts to an effective density of nano-LEDs 30 of $D=5 \cdot 10^6$ wires/cm$^2$, since only one wire out of two will take part in the emission of light. Assuming an average radius of a nano-LED 30 of approximately 1 μm, a core height L3 greater than 3 μm is sufficient to fulfill the previous condition, knowing, besides, that it is currently possible to manufacture nano-LEDs having an average core height of 10 μm.

Other embodiments of the invention will now be described in relation with FIGS. 10 to 15. Although these embodiments are described in relation with nano-LEDs 110, it should be understood that these embodiments also apply to other types of nano-LEDs, for example, those described in FIGS. 1 and 2.

Figure 10:
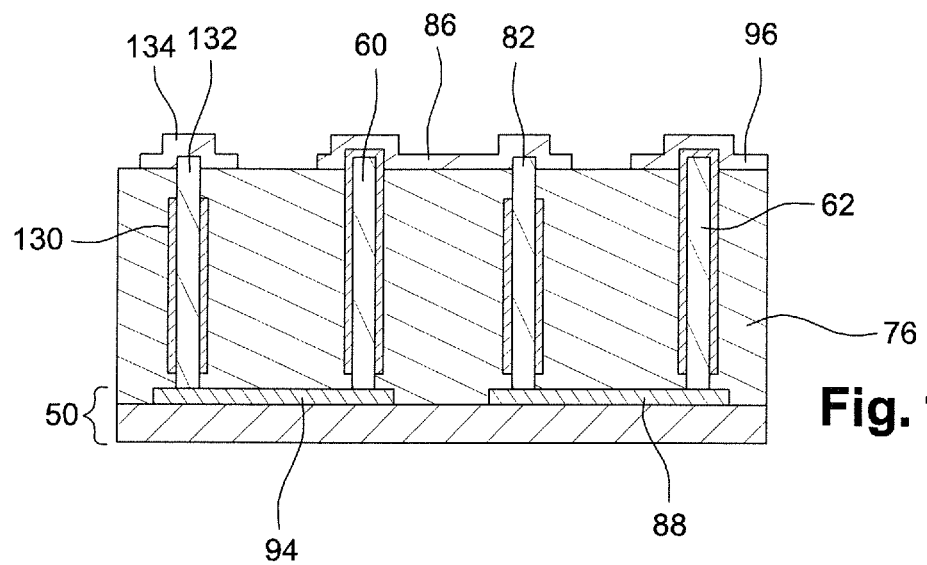
FIG. 10 is a simplified cross-section view of an embodiment where the electric power supply contacts are formed on the same surface of a nano-LED device.

FIG. 10 illustrates an embodiment where the power supply contacts are arranged on the same surface of the device. This embodiment differs from that described in relation with FIG. 5 in that it comprises an additional connection nanowire 130, for example, identical to connection nanowire 82, arranged on lower contact 94, for example, identical to lower contact 88, and having its head 132 connected to a second upper contact 134. The assembly is thus electrically powered through two upper contacts 96 and 134.

Figure 11:
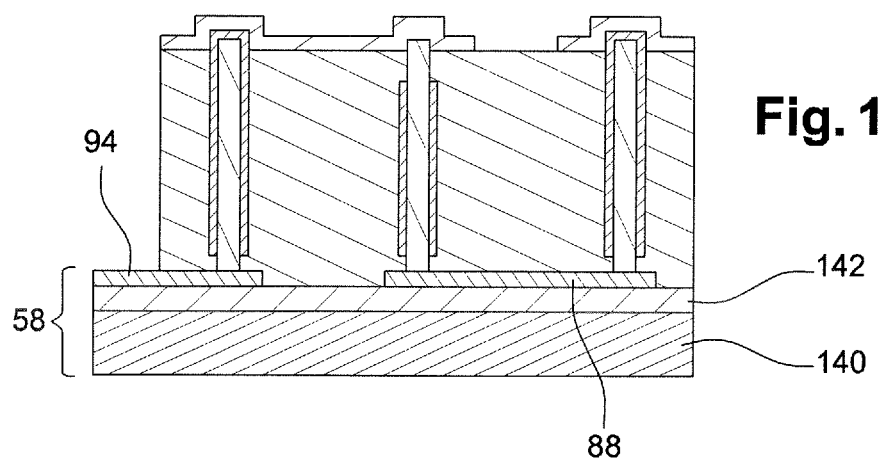
FIG. 11 is a simplified cross-section view of an embodiment where the support having the nanowires formed thereon comprises a common conductive layer.

FIG. 11 illustrates an embodiment where support 58 comprises a first conductive layer, made of silicon, for example, covered with an insulating layer 142, made of AlN, SiN$_x$ or SiO$_2$ for example, having contacts 88, 94 formed thereon. This embodiment thus enables to use a silicon substrate or a metal substrate, that is, a substrate of low cost and large surface area with respect to the insulating substrate, especially made of sapphire, such as used in the previous embodiments. It should be noted that the fact that the substrate is conductive is not used herein.

Figure 12:
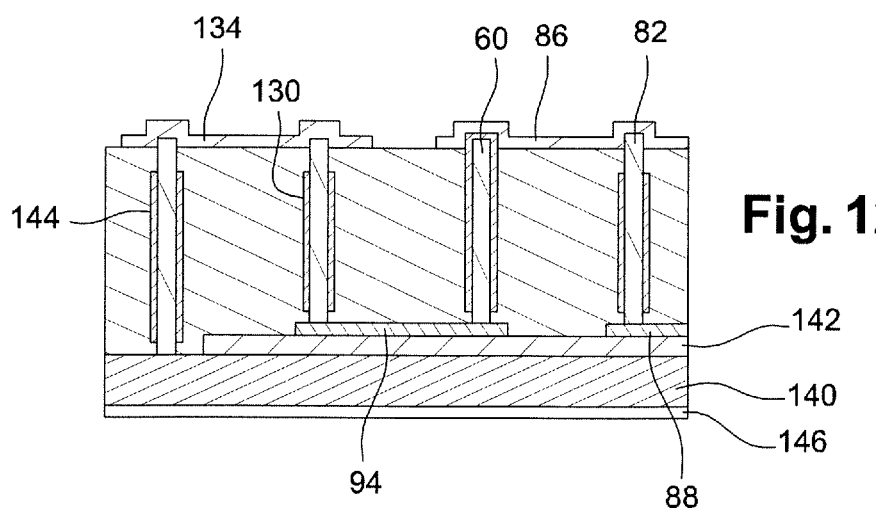
FIG. 12 is a simplified cross-section view of an embodiment where the support having the nanowires formed thereon comprises a common conductive layer and where nanowires are directly formed on this layer.

FIG. 12 illustrates an embodiment where the power supply contacts are taken on either side of the structure. For example, a surface of conductive layer 140 of FIG. 12 is exposed and nanowire 144, in the shown example, a connection nanowire, is formed on layer 140 and has its head in contact with an upper contact 134. A lower power supply contact 146 is further provided on the lower surface of layer 140. First, this embodiment also has the advantage of using a conductive substrate, for example, Si or a metal substrate, of low cost and large surface area. Further, the fact that the substrate is conductive is used due to:

connection nanowire 144 directly grown by epitaxy on conductive substrate 140;

and contact 146 at the rear surface of substrate 140.

Thus, the power supply contacts are arranged on either side of structure 82, 146. This provides the advantage of not having to clear the way to a lower contact 94 such as for example illustrated in FIG. 11 at the nanowire level.

The following embodiments enable to improve the extraction of light.

Figure 13:
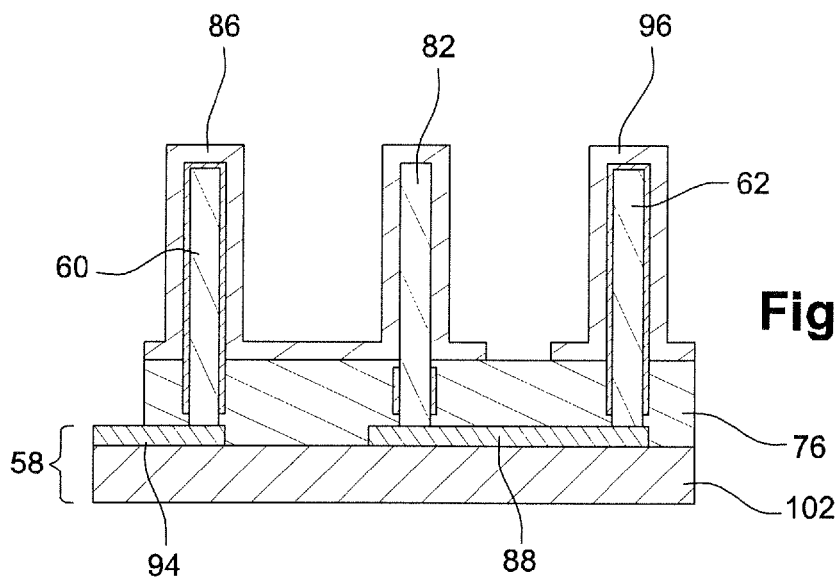
FIG. 13 is a simplified cross-section view of an embodiment where the upper contacts of the series connection are formed on a significant portion of the height of the nanowires.

In FIG. 13, insulating and planarizing layer 76 is only formed on a small portion of the height of nano-LEDs 60, 62 and connection nanowires 82. Thus, the average effective refraction index of the general structure is decreased, since the nanowires are now surrounded with air, which has a lower refraction index than planarizing layer 76, thus allowing a better extraction of light. A second advantage of this embodiment is the increase of the contact surface area between the shell of nano-LEDs 60, 62 and upper contacts 86, 96. The hole injection efficiency is improved. It should be noted that this type of contact formed on a large portion of the nano-LEDs may also be used in the context of a parallel connection.

Figure 14:
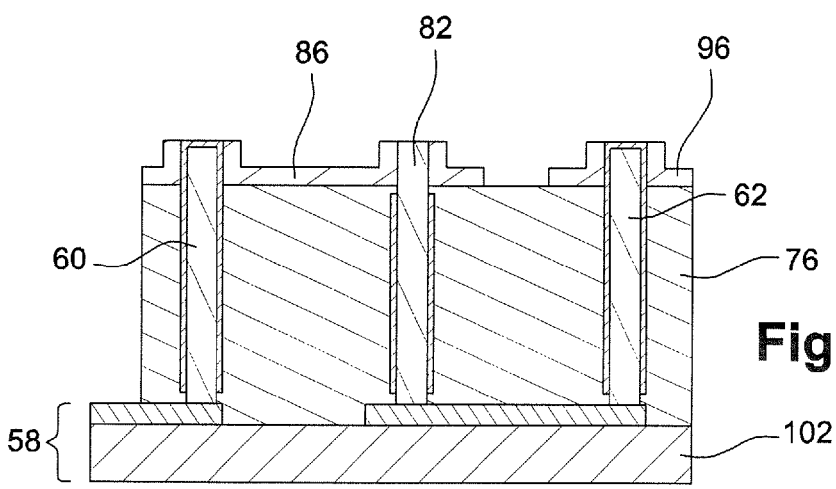
FIG. 14 is a simplified cross-section view of an embodiment where the upper contacts of the series connection do not cover the upper horizontal portion of the nanowires.

In FIG. 14, the horizontal portion of upper contacts 86, 96 which covers the top of nano-LEDs 60, 62 is removed to avoid the absorption of light guided at the top of said nano-LEDs 60, 62. Similarly, or optionally, the horizontal portion of contact 86 is removed from connection nanowire 82.

Figure 15:
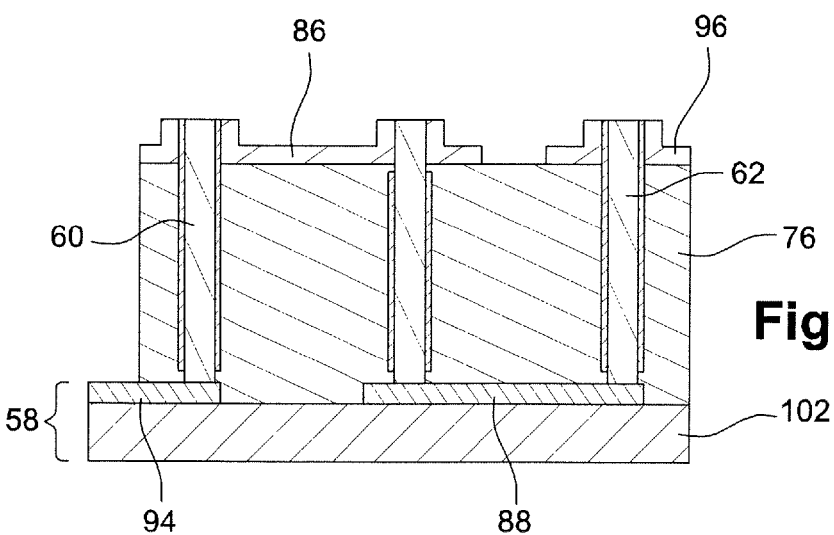
FIG. 15 is a simplified cross-section view of an embodiment where the upper contacts of the series connection do not cover the upper horizontal portion of the nanowires and where the horizontal portion of shells of core/shell-type nano-LEDs is removed.

As illustrated in FIG. 15, it is also possible to remove the upper portion of shell 118 of nano-LEDs 60, 62 as long as core 116 thereof is not in direct contact with contact 86, 96.

Further, as concerns nano-LEDs of core/shell type with multiple quantum wells having both radial wells (vertical) on the sides of the wires and also axial wells (horizontal) at the top of the wires, such quantum wells thus have different growth directions, which greatly influences their optical properties (different In compositions, for example, different thicknesses, etc.). In particular, the piezoelectric fields which are present in the axial wells only greatly limit their efficiency. By removing the horizontal portion of upper contact 86, the axial wells will not be crossed by the electric current. Thus, only the radial wells will be efficiently excited, which enables to improve the emission efficiency and the homogeneity of the devices.

A method for manufacturing nano-LEDs of core/shell type 60, 62 series-connected by a connection nanowire 82 will now be described in relation with FIGS. 16 to 22.

Figure 16:
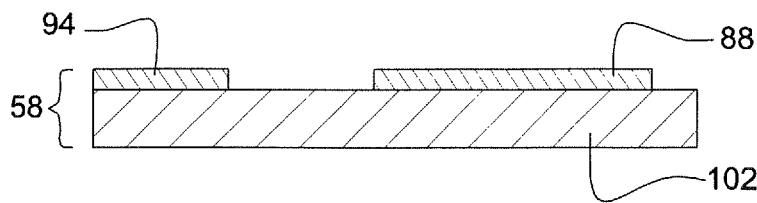
FIGS. 16 to 22 are simplified cross-section views illustrating a first method for manufacturing a series connection according to the invention.

The method starts with the forming of support 58 with the different power supply contacts 94 and the contacts of series connection 88 (FIG. 16). For example, conductive metal or doped semiconductor areas 88, 94 is deposited on an electrically-insulating substrate 102, for example, a substrate of 2-inch sapphire type. For example, an n-doped GaN layer having a 400-nm thickness is grown by epitaxy on the entire surface of substrate 102, after which a lithography step (optical or electronic) is implemented to locally etch this layer to form an alternation of local insulating and conductive areas. A planar technology is thus used.

The method carries on with the growth of the nano-LED cores.

For example, for nano-LEDs 30 described in relation with FIG. 2, this step starts with the local growth of n-doped GaN nanowires forming core 34 of nano-LEDs 30, after which, in a second manufacturing step, a radial deposition of active area 36 is performed by forming an alternation of thin layers of unintentionally-doped GaN barriers and InGaN wells. The barriers and the wells may have a thickness ranging from 10 nanometers to 3 nanometers, respectively. For example, cores 34 are formed by means of a GaN heteroepitaxy on contacts 88, 94, especially by MOVPE ("Metal Organic Vapor Phase Epitaxy"), by MBE ("Molecular Beam Epitaxy"), or by HVPE (for "Hydride Vapor Phase Epitaxy") according to a so-called spontaneous mode, as described in document WO-A-2007/141333 for example, or selectively by means of a growth mask 200.

Cores 34 are either in direct contact with support 58, or in indirect contact therewith, via a thin AlN or $SiN_x$ of a few nanometers interposed between support 58 and cores 34. This layer being very thin, the electric continuity is always verified. However, such a layer eases the growth of nanowires and improves their verticality.

Figure 17:
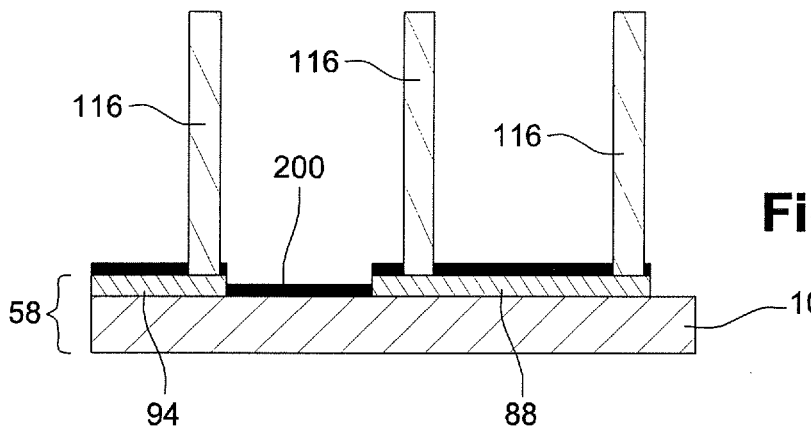

As concerns the manufacturing of nano-LEDs 110, illustrated in FIG. 17, a hetero-epitaxy, for example of thick InGaN, is performed on contacts 88, 94 to obtain cores 116. This growth of cores 116 is for example carried out by MOCVD, by MBE, or by HVPE according to a spontaneous mode or selectively by means of selective growth mask 200. No dopant is used during the growth of InGaN, which then has a residual doping lower than $10^{16}$ electrons/cm$^3$.

Figure 18:
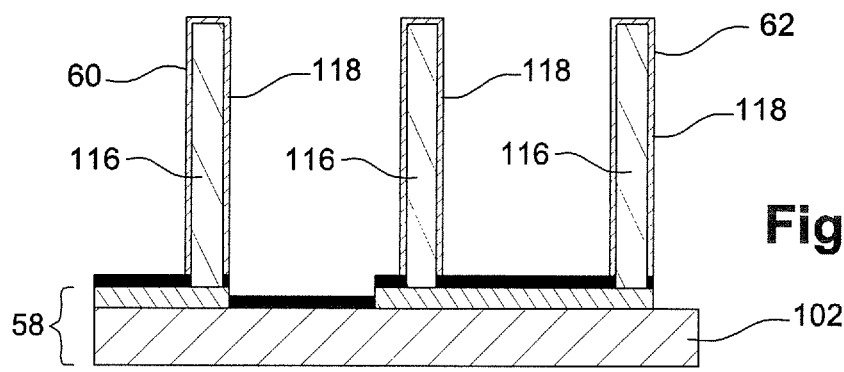

A shell is then formed around each core, for example, of p-doped GaN or InGaN (FIG. 18).

In the case of nano-LEDs 110, the shell doping, for example, provided by a magnesium doping, is selected to be on the order of $10^{18}$ holes/cm$^3$, et the indium composition is either zero (GaN-p), or, if different from 0, lower than that of the thick InGaN of cores 116 to ensure the carrier confinement, since the addition of indium in the active area decreases the gap of the material, which generates a potential well for carriers.

The shells are for example formed by means of a radial deposition such as previously described. The shells of the nano-LEDs are insulated from support 58 by using an electrically-insulating selective growth mask 200 made of $SiN_x$ or $SiO_2$, for example, if the cores have been formed by means of a selective growth or a mask specifically provided for this purpose is used. The mask is optionally removed after the wire growth step, for example, by chemical etching.

Figure 19:
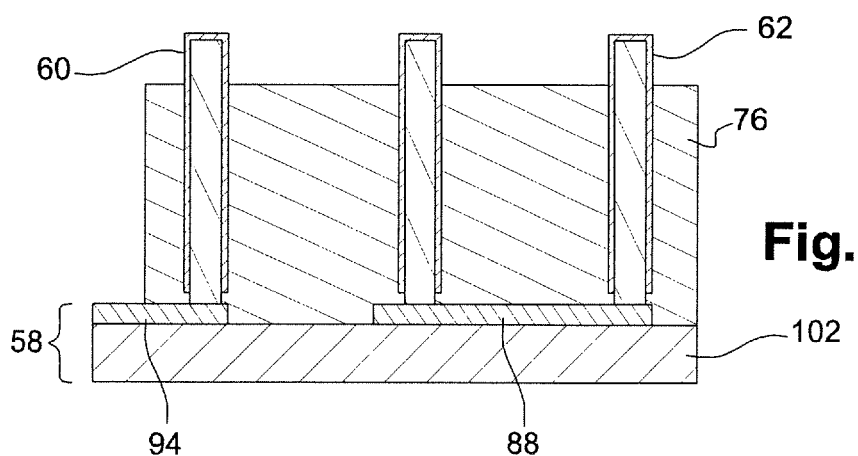

The method then carries on with the filling of the spaces between nano-LEDs with a planarizing and electrically-insulating material 76, for example a dielectric such as a polymer or $SiO_2$, for example according to the embodiment described in patent WO-A-2009/87319A1 (FIG. 19). Planarizing layer 76 is deposited to let the heads of the nano-LEDs emerge by a height greater than the desired final height.

If a lower power supply contact 94 is desired, a step of additional etching of planarizing material 76 is then implemented to expose a lower contact area for the injection of current (FIG. 19).

Figure 20:
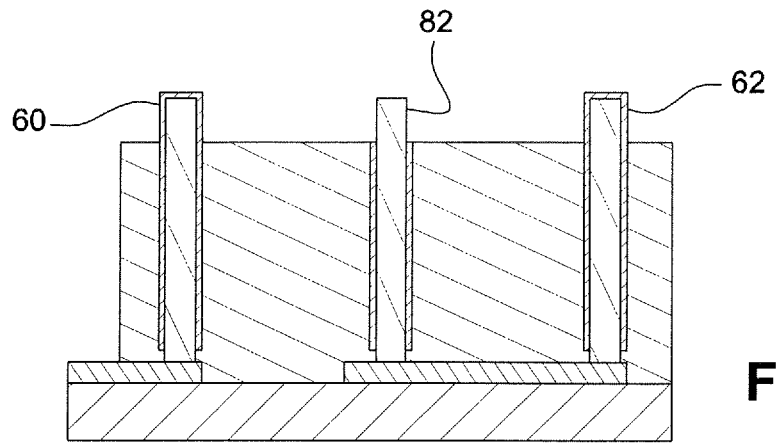

Connection nanowires 82 are then formed from nano-LEDs. Especially, the free portion of the shells of nano-LEDs 60, 62 intended to form connection nanowires is removed. For example, a lithography step is implemented to protect the nano-LEDs intended to emit light by depositing thereon an insulating material, for example, $SiO_2$, after which a chemical or physical etching is performed, which disengages the core of the connection nanowires (FIG. 20).

Figure 21:
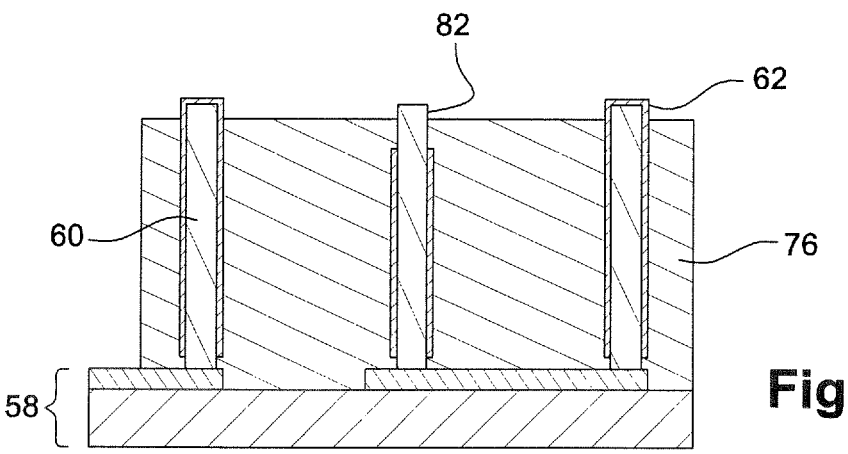

The protection mask of nano-LEDs 60, 62 is then removed, after which insulating and planarizing material is deposited again to complete layer 76 (FIG. 21).

Figure 22:
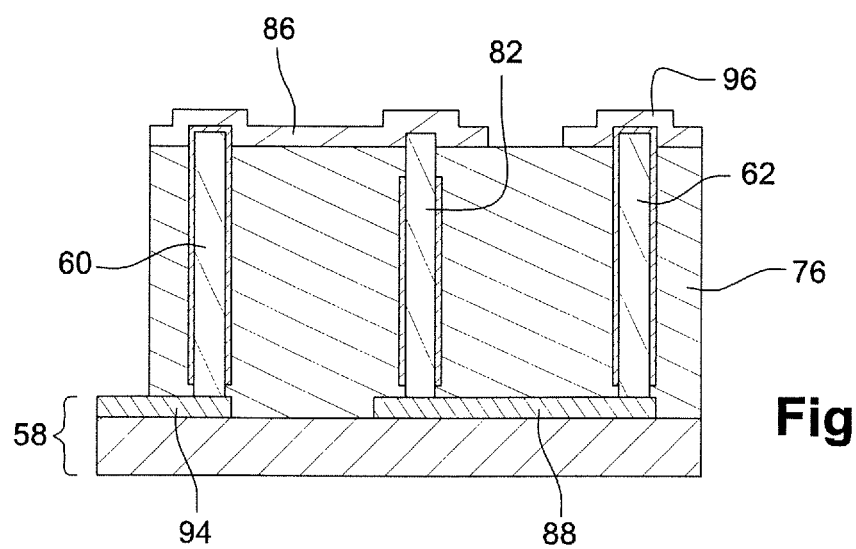

The method then ends with the deposition of conductive contacts 86, 96, for example, metallic (FIG. 22). These contacts are made, at least above nano-LEDs 60, 62, of a semitransparent material to allow the extract of light from the top of the nano-LEDs. Thin metal layers (Ni/Au, Pd/Au, Pt/Au) or an ITO (Indium Tin Oxide) layer can be mentioned as an example. A planar technology is thus used.

Figure 23:
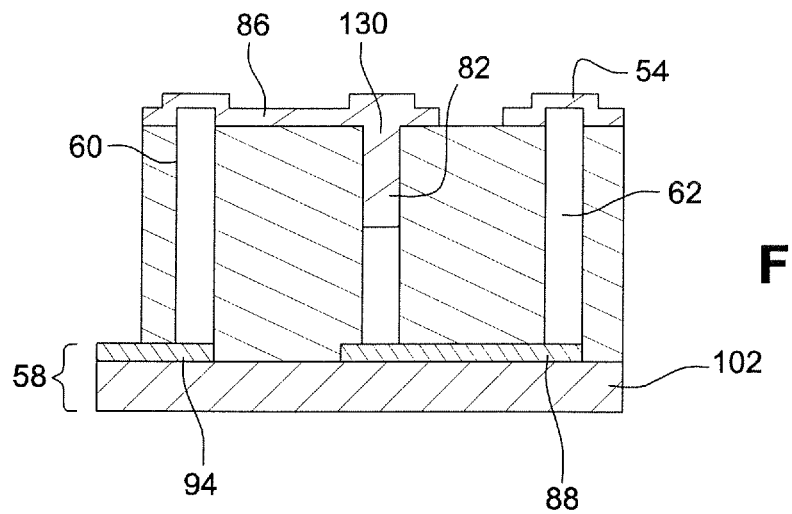
FIG. 23 is a simplified cross-section view of a series connection between nano-LEDs of FIG. 1.

Nano-LEDs of core/shell type have been described up to now. Of course, the invention applies to any type of LED in the form of nanowires, such as for example the nano-LEDs described in relation with FIG. 1. As illustrated in FIG. 23, it comprises substantially the same elements of series connection between two nano-LEDs 60, 62, connection nanowires 82 being for example formed by removing the upper portion of a nano-LED to expose area 14 and by completing area 14 with a conductive nanowire, for example metallic, in contact with contact 86.

As previously specified, the series connection may be formed from nano-LED to nano-LED or from a group of nano-LEDs connected in parallel to another group of nano-LEDs connected in parallel.

Figure 24:
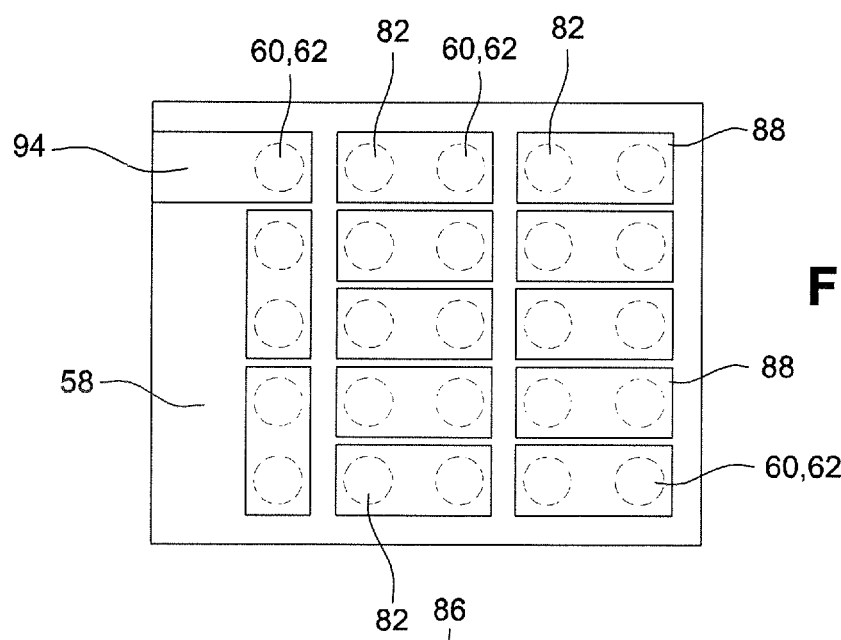
FIGS. 24 and 25 are simplified top views, respectively, of lower and upper contacts of an array of series-connected nano-LEDs.
Figure 25:
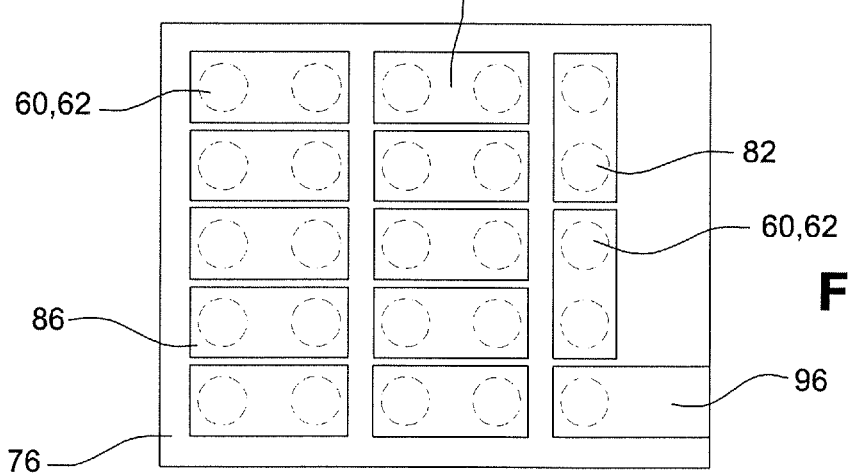

FIGS. 24 and 25 illustrate an example of an array of nano-LEDs 60, 62 by three series-connected nano-LEDs 60, 62. FIG. 24 is a top view illustrating contacts 88 of the support, and FIG. 25 is a top view illustrating contacts 86 on planarizing layer 76.

Figure 26:
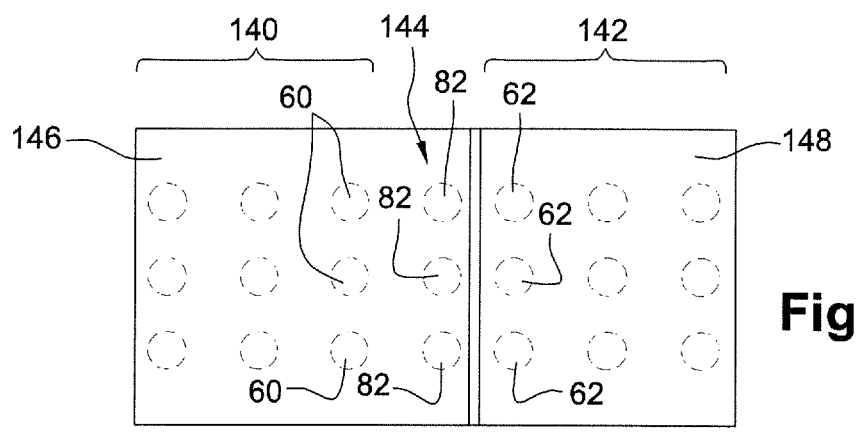
FIGS. 26 and 27 are simplified top views, respectively, of lower and upper contacts of two arrays of series-connected nano-LEDs.
Figure 27:
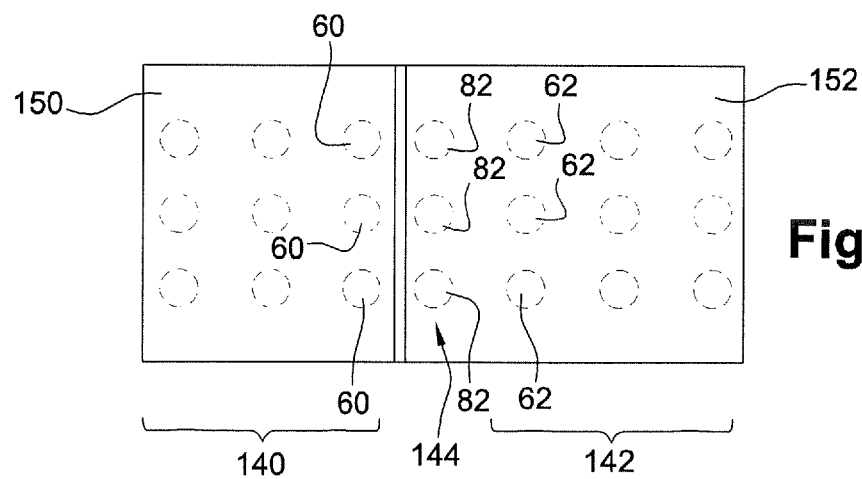

FIGS. 26 and 27 illustrate an example of series connection of two arrays 140, 142 of three nano-LEDs by three nano-LEDs connected in parallel, arrays 140, 142 being series-connected by a column 144 of connection nanowires 82. FIG. 26 is a top view illustrating a contact 146 of the support having the nano-LEDs of array 140 and connection nanowires 82 formed thereon, and a contact 148 of support 58, electrically insulated from contact 146, having the nano-LEDs of array 142 formed thereon. FIG. 27 is a top view illustrating a contact 150 made on planarizing layer 76 in contact with the nano-LEDs of array 140, and a contact 152 on planarizing layer 76, electrically insulated from contact 150 and in contact with the nano-LEDs of array 142 and connection nanowires 82.

Such a connection diagram makes the device operation reliable in the case where certain nano-LEDs would be defective. Further, it should be noted that in the illustrated diagram, the number of connection nanowires 82 is smaller than the number of nano-LEDs 60, 62 divided by 2. The number of connection nanowires 82 may however be greater, and determined according to the involved current densities.

Considering a light-emitting device powered with a mains voltage of approximately 240 volts, it is thus possible to envisage, as an example, the connection of 68 nanodiodes or nanodiodes assemblies (themselves connected in parallel) powered under an average 3.5-volt voltage.

Each time current flows through a nano-LED 60, 62, an average 3.5-volt drop appears. It is thus possible to directly branch an assembly of 68 series-connected nano-LEDs to a 240-volt domestic power plug, possibly by adding an A.C./D.C. converter to avoid an intermittent light emission due to the A.C. character of domestic power systems. It is thus no longer needed to use a transformer to decrease the power supply voltage.

Further, by connecting in parallel at least two branches of 68 nano-LEDs having opposite operating directions, that is, having a connection diagram equivalent to two diodes head-to-tail in parallel, it is possible to do away with the A.C./D.C. converter since each branch will be conductive in turn and light will continuously be emitted.

This connection diagram enables to do away with the control electronics of LED devices, which are fragile parts limiting the lifetime of such devices and which strongly increase the cost thereof.

Nano-LEDs formed of materials from the family of GaN materials have been described. Direct gap materials are also usable for the emission of light, especially materials with a wide gap for the generation of light in the UV-blue spectral range (ZnO), or small-gap materials (GaAs, GO, InP) for the generation of light in the red and infrared spectral range.

Different types of substrates can also be envisaged, and especially substrates which are good heat conductors for a better heat removal.

It is also possible to design a device emitting white light due to the encapsulation of a previously-described device in a material containing phosphoruses.

It is also possible to design a device emitting white light due to the series connection of different categories of nano-LEDs: a category emitting in blue, a second category emitting in green, and a third category emitting in red. For example, for each category, nano-LEDs, for example, of core/shell type, are connected in parallel. The modulation of the emitted wavelength is advantageously obtained by modifying the wire diameter, which is made easy by the selected growth method, that is, advantageously, a local growth.

Due to the invention, it is thus possible to implement a series electric connection of nano-LEDs, which especially has the advantage of allowing:

an interconnection of unlimited length;
a homogeneity of the injected current density to power the nano-LEDs, and therefore a stable light intensity and a (imitation of the occurrence of hot points which may damage the materials (especially the contacts);
a significant general power supply, whereby the current leads conduct a lower current, which makes the device operation reliable while maintaining a constant injected electric power;
a possible A.C. or D.C. power supply control since it especially possible to power the nano-LEDs via the domestic system voltage without using A.C./D.C. converters or transformers.

The invention claimed is:

1. An optoelectronic device comprising at least:
a first light-emitting nanowire and a second light-emitting nanowire formed on a support and each comprising a semiconductor area of a first type for the injection of holes and a semiconductor area of a second type for the injection of electrons; and
a series electric connection of the first and second light-emitting nanowires comprising
a connection nanowire formed on the support and comprising
a first region capable of forming with the semiconductor area of the first type for the injection of holes of the first light-emitting nanowire an electric path enabling an electric current to flow,
a second region capable of forming with the semiconductor area of the second type for the injection of electrons of the second light-emitting nanowire an electric path enabling an electric current to flow, and
a third region in contact with the first and second regions enabling an electric current to flow therebetween,
a first conductive area connecting the semiconductor area of the first type for the injection of holes of the first light-emitting nanowire and the first region of the connection nanowire and electrically insulated from the second light-emitting nanowire, and
a second conductive area connecting the second region of the connection nanowire and the semiconductor area of the second type for the injection of electrons of the second light-emitting nanowire and electrically insulated from the first light-emitting nanowire;
wherein each of the first and second light-emitting nanowires comprises a semiconductor core having an end thereof formed on the support forming one of the semiconductor area of the first type for the injection of holes and the semiconductor area of the second type for the injection of electrons, and a semiconductor shell surrounding the core at least over an upper portion thereof and forming the other one of the semiconductor area of the first type for the injection of holes and the semiconductor area of the second type for the injection of electrons,
wherein the core of the first and second light-emitting nanowires is formed of a semiconductor material of a first conductivity type, the shell of the first and second light-emitting nanowires is formed of a semiconductor material of a second conductivity type, opposite to the first conductivity type, and the connection nanowire comprises at least one core made of the material of the first conductivity type.

2. The optoelectronic device of claim 1, wherein the connection nanowire comprises a semiconductor core of the first type having no shell on at least a first and a second portion respectively forming the first and the second region of the connection nanowire.

3. The optoelectronic device of claim 2, wherein the first portion of the core of the connection nanowire comprising no shell comprises the nanowire end opposite to the support.

4. The optoelectronic device of claim 1, wherein the support comprises a planar electrically-insulating layer having a planar conductive contact forming the second conductive area formed thereon, the contact having the connection nanowire and the second light-emitting nanowire formed thereon.

5. The optoelectronic device of claim 1, wherein the light-emitting nanowires and the connection nanowires are embedded in an electrically-insulating and planar layer, ends of the light-emitting nanowires and the connection nanowires opposite to the support slightly emerging from the electrically insulating and planar layer defining and emerging ends, the electrically insulating and planar layer having a conductive contact forming the first conductive area and surrounding the emerging ends of the first light-emitting nanowire and of the connection nanowire formed thereon.

6. The optoelectronic device of claim 1, comprising a network of light-emitting nanowires series-connected by series electric connections.

7. The optoelectronic device of claim 1, comprising a network of light-emitting nanowires formed of at least two assemblies of light-emitting nanowires electrically connected in parallel, at least one nanowire of a first assembly of the at least two assemblies being series-connected with a nanowire of a second assembly of the at least two assemblies by a series electric connection.

\* \* \* \* \*